(12) United States Patent
Park et al.

(10) Patent No.: US 12,721,239 B2
(45) Date of Patent: Aug. 25, 2026

(54) ELECTRONIC DEVICES AND METHODS OF MANUFACTURING ELECTRONIC DEVICES

(71) Applicant: Amkor Technology Singapore Holding Pte. Ltd., Valley Point (SG)

(72) Inventors: Min Won Park, Incheon (KR); Tae Yong Lee, Gyeonggi-do (KR); Bo Yoon Yoo, Incheon (KR)

(73) Assignee: Amkor Technology Singapore Holding Pte. Ltd., Singapore (SG)

(*) Notice: Subject to any disclaimer, the term of this patent is extended or adjusted under 35 U.S.C. 154(b) by 617 days.

(21) Appl. No.: 17/855,429

(22) Filed: Jun. 30, 2022

(65) Prior Publication Data

US 2024/0006279 A1 Jan. 4, 2024

(51) Int. Cl.

| | |
|---|---|
| ***H10W 90/00*** | (2026.01) |
| ***H10W 42/00*** | (2026.01) |
| ***H10W 42/20*** | (2026.01) |
| ***H10W 70/05*** | (2026.01) |
| ***H10W 70/60*** | (2026.01) |

(Continued)

(52) U.S. Cl.

CPC ....... *H10W 90/701* (2026.01); *H10W 70/093* (2026.01); *H10W 70/65* (2026.01); *H10W 74/016* (2026.01); *H10W 74/117* (2026.01); *H10W 74/121* (2026.01); *H10W 74/124* (2026.01); *H10W 90/00* (2026.01);

(Continued)

(58) Field of Classification Search

CPC . H01L 21/565; H01L 23/3135; H01L 23/315; H01L 21/56; H01L 25/0655; H01L 23/481

See application file for complete search history.

(56) References Cited

U.S. PATENT DOCUMENTS

| | | | |
|---|---|---|---|
| 7,745,910 | B1 | 6/2010 | Olson et al. |
| 8,102,032 | B1 | 1/2012 | Bolognia et al. |

(Continued)

FOREIGN PATENT DOCUMENTS

| | | | |
|---|---|---|---|
| KR | 20220031414 A | * | 3/2022 |
| KR | 20220152131 A | * | 11/2022 |

*Primary Examiner* — Joshua Benitez Rosario
*Assistant Examiner* — Moataz Khalifa
(74) *Attorney, Agent, or Firm* — Kevin B. Jackson

(57) ABSTRACT

In one example, an electronic device includes a substrate having a substrate top side, a substrate bottom side opposite to the substrate top side, and a substrate conductive structure. The substrate conductive structure includes a grounded path and a powered path. An electronic component is coupled to the substrate top side. An encapsulant covers the electronic component and the substrate top side. The encapsulant includes apertures and the powered path is exposed by the apertures. A first network structure includes a first network cover over the encapsulant. and first network interconnects coupled to the first network cover and the powered path through the apertures. A second network structure includes a second network cover having a second cover ceiling and second cover sidewalls extending from the second cover ceiling; and a second network contact coupled to the second network cover and the grounded path. The second network cover is over the first network cover and the first network cover is over the first electronic device. Other examples and related methods are also disclosed herein.

20 Claims, 15 Drawing Sheets

(51) Int. Cl.

| | |
|---|---|
| ***H10W 70/65*** | (2026.01) |
| ***H10W 70/685*** | (2026.01) |
| ***H10W 72/00*** | (2026.01) |
| ***H10W 72/50*** | (2026.01) |
| ***H10W 74/00*** | (2026.01) |
| ***H10W 74/01*** | (2026.01) |
| ***H10W 74/10*** | (2026.01) |
| ***H10W 95/00*** | (2026.01) |

(52) U.S. Cl.

CPC .......... *H10W 74/00* (2026.01); *H10W 90/724* (2026.01); *H10W 90/754* (2026.01)

(56) References Cited

U.S. PATENT DOCUMENTS

| | | | | |
|---|---|---|---|---|
| 8,269,342 | B2 * | 9/2012 | Kim .................. | H01L 23/49816 257/713 |
| 9,171,770 | B2 * | 10/2015 | Chen ..................... | H01L 23/552 |
| 9,691,711 | B2 | 6/2017 | Mahajan et al. | |
| 2019/0214367 | A1 * | 7/2019 | Chen ................... | H01L 23/5384 |
| 2022/0359420 | A1 * | 11/2022 | Kim ...................... | H01L 23/552 |

* cited by examiner

A'
130
142
NS2
152
141
NS1
151
190
100
A 110
111
1112
1111
1113
1111x
1111y
112
1124
112a
1125

121
120
1123

130
1112
1111
1113
111
121
120
121
120
1123
1124
112a
1125
112
110

130
1312
131
1311
130x
1112
1111
1113
111
121
120
121
120
1123
1124
112a
1125
112
110

130
162
160
161
142
140
141
111
121
120
1123
110
121
120
1124
112
150
151
1121
152
1125
1122

170
130
162
160
161
142
140
141
111
121
120
1123
110
121
120
1124
112
150
151
1121
152
1125
1122

ELECTRONIC DEVICES AND METHODS OF MANUFACTURING ELECTRONIC DEVICES

CROSS-REFERENCE TO RELATED APPLICATIONS

Not Applicable.

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1A:
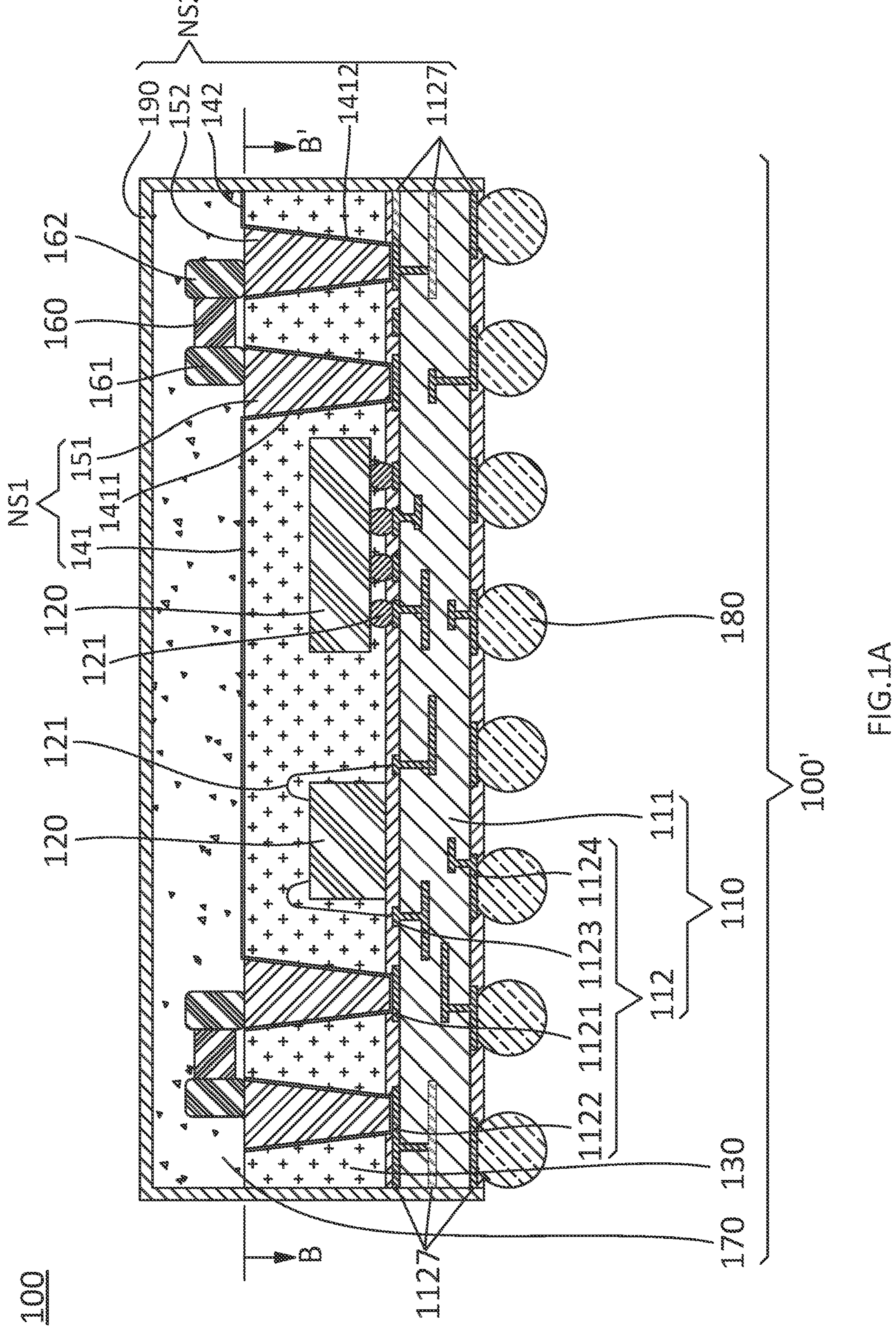
FIGS. 1A and 1B show cross-sectional views of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a element discussed in this disclosure could be termed a element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements.

DESCRIPTION

The present description includes, among other features, structures and associated methods that relate to electronic devices including, for example, semiconductor devices configured in power distribution network (PDN) packages. In some examples, a portion of the PDN is provided at least in part over and within a package body, which is over a package substrate. Various structures and methods are described for connecting the PDN to the substrate and for providing a grounding structure or grounded path for decoupling the PDN. In some examples, a shield is provided over the package body and portions of the package substrate and can be connected to the grounding structure. Among other things, the structures and methods provide a cost effective PDN implementation having improved performance.

In an example, an electronic device includes a substrate having a substrate top side, a substrate bottom side opposite to the substrate top side, and a substrate conductive structure. The substrate conductive structure includes a grounded path and a powered path. A first electronic component is coupled to the substrate top side. A first encapsulant covers the first electronic component and the substrate top side. The first encapsulant includes first apertures and the powered path is exposed by the first apertures. A first network structure includes a first network cover over the first encapsulant; and first network interconnects coupled to the first network cover and the powered path through the first apertures. A second network structure includes a second network cover having a second cover ceiling and second cover sidewalls extending from the second cover ceiling; and a second network contact coupled to the second network cover and the grounded path. The second network cover is over the first network cover and the first network cover is over the first electronic component.

In an example, an electronic device includes a substrate having a substrate top side, a substrate bottom side opposite to the substrate top side, and a substrate conductive structure, which includes a first power terminal at the substrate top side, and a ground terminal at the substrate top side. A first electronic component coupled to the substrate top side and a first encapsulant covers the first electronic component and the substrate top side The first encapsulant includes a first aperture and a second aperture, wherein the first power terminal is exposed by the first aperture, and the ground terminal is exposed by the second aperture. A network conductive layering includes a first network cover over a top side of the first encapsulant, a first interconnect contact in the first aperture and coupled to the first power terminal and the first network cover, and a second interconnect contact in the second aperture and coupled to the ground terminal. A second network cover includes a second cover ceiling over the first network cover, and second cover sidewalls extending from the second cover ceiling. The second network cover is coupled to the ground terminal.

In an example, a method of manufacturing an electronic device includes providing a substrate having a substrate top side, a substrate bottom side opposite to the substrate top side, and a substrate conductive structure, which comprises a grounded path and a powered path. The method includes coupling a first electronic component to the substrate top side. The method includes providing a first encapsulant covering the first electronic component and the substrate top side and having first apertures exposing the powered path. The method includes providing a first network structure having a first network cover over the first encapsulant and first network interconnects coupled to the first network cover and the powered path through the first apertures. The method includes providing a second network structure having a second network cover having a second cover ceiling and second cover sidewalls extending from the second cover ceiling. The method includes providing a second network contact coupled to the second network cover and the grounded path, wherein the second network cover is over the first network cover, and the first network cover is over the first electronic component.

Other examples are included in the present disclosure. Such examples may be found in the figures, in the claims, or in the description of the present disclosure.

Figure 1B:
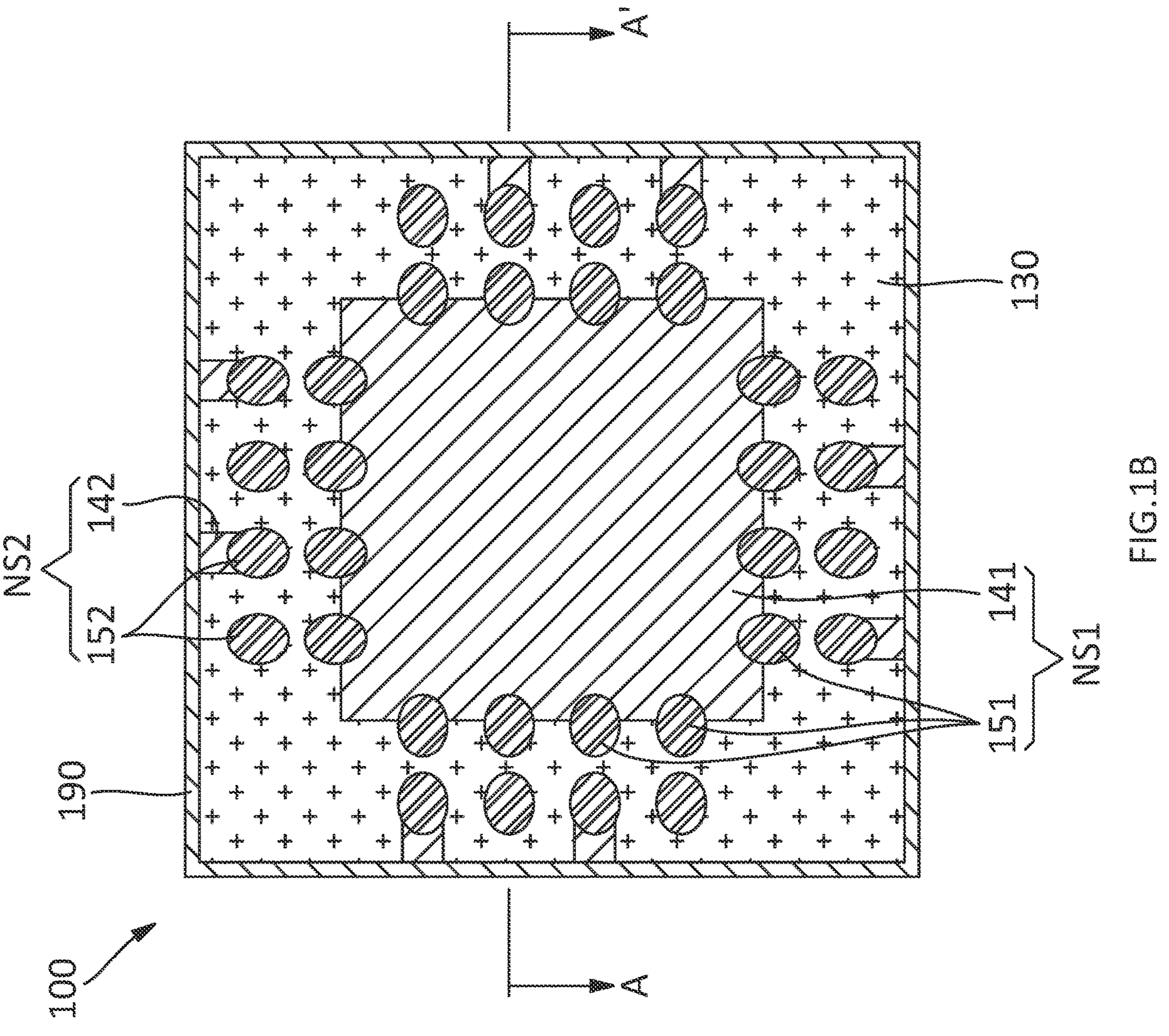

FIGS. 1A and 1B show cross-sectional views of an example electronic device 100. FIG. 1A shows a cross-sectional view taken along line A-A' of FIG. 1B, and FIG. 1B shows a cross-sectional view taken along line B-B' of FIG. 1A. In the example shown in FIGS. 1A and 1B, electronic device 100 can comprise substrate 110, electronic components 120 and 160, encapsulants 130 and 170, network structures NS1 and NS2 and external terminals 180.

Substrate 110 can comprise dielectric structure 111 and conductive structure 112 comprising internal terminals 1121, 1122, 1123 and external terminals 1124. Electronic components 120 and 160 can comprise component terminals 121 and 161.

In some examples, network structure NS1 can comprise network cover 141 and interconnect 151. In some examples, network structure NS2 can comprise, network cover 190, interconnect 152, and network contact 142.

In some examples, network structure NS1 can comprise network cover 141, interconnect contact 1411, or interconnect 151. In some examples, network structure NS1 can comprise or be referred to as a grid structure or a node structure. In some examples, network structure NS1 can comprise or be referred to as a power network structure configured to carry a power voltage of electronic device 100, and can be coupled to internal terminal 1121 of substrate 110.

In some examples, network structure NS2 can comprise network contact 1127, network contact 142, interconnect contact 1412, interconnect 152, or network cover 190. In some examples, network structure NS2 can comprise or be referred to as a grid structure or a node structure. In some examples, Network structure NS2 can comprise or be referred to as a ground network structure configured to carry a ground voltage of electronic device 100, and can be coupled to internal terminal 1122 of substrate 110.

In some examples, the polarities of network structures NS1 or NS2 can be inverted, such that network structure NS1 can instead comprise or be referred as a ground network structure, or network structure NS2 can instead comprise or be referred as a power network structure. In some examples, network structure NS1 or NS2 can be referred to as a first network structure and network structure NS2 or NS1 can be referred to as a second network structure.

Substrate 110, encapsulants 130 and 170, network structures NS1 and NS2 and external terminals 180 can comprise or be referred to as an electronic package 100' or package 100'. Electronic package 100' can provide protection for electronic components 120 and 160 from external elements or environmental exposure. Electronic package 100' can provide electrical coupling between another electronic package and electronic components 120 and 160.

FIGS. 2A, 2B, 2C, 2D, 2E, 2F, 2G, 2H, 2I, and 2J show cross-sectional views of an example method for manufacturing electronic device 100. FIGS. 3A and 3B show top views of portions of the example method for manufacturing electronic device 100.

Figures 2A, 2B:
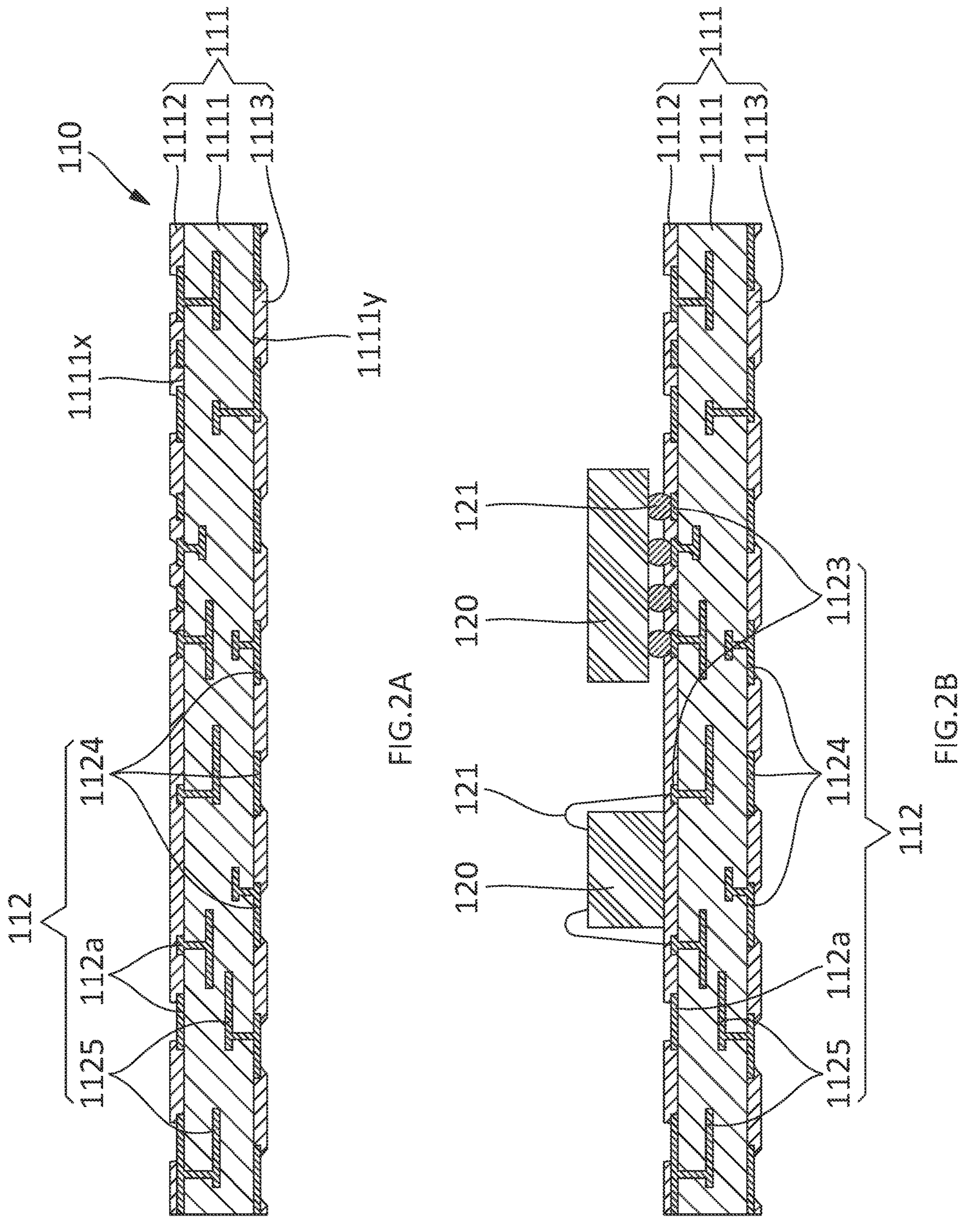
FIGS. 2A, 2B, 2C, 2D, 2E, 2F, 2G, 2H, 2I and 2J show cross-sectional views of an example method for manufacturing an example electronic device.
Figure 3B:
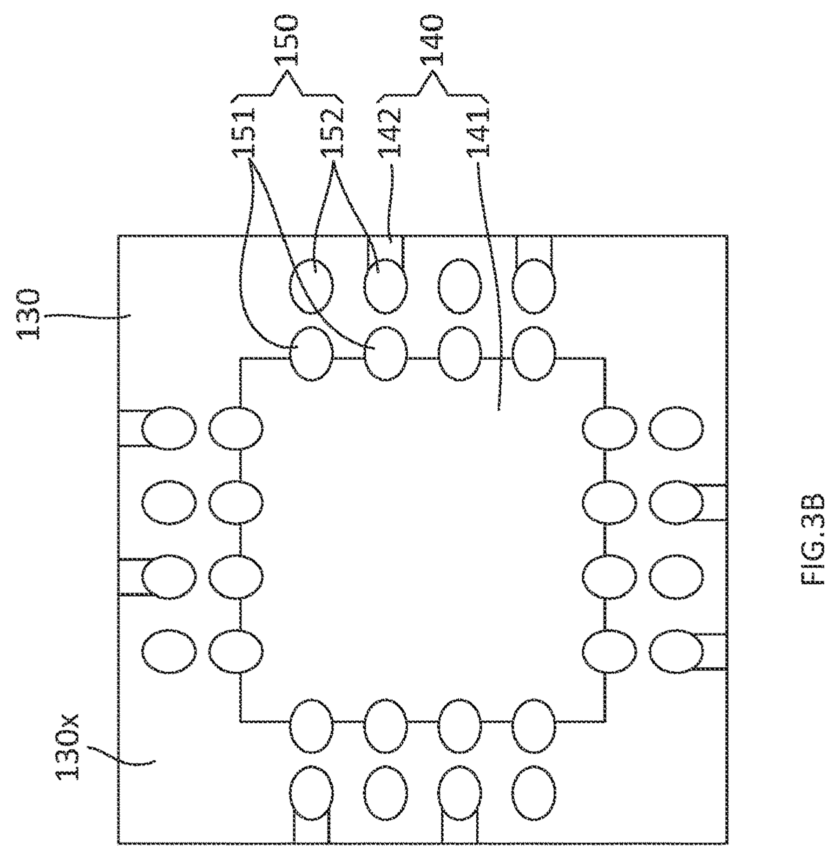
FIGS. 3A and 3B show top views of an example method for manufacturing an example electronic device.
Figure 3A:
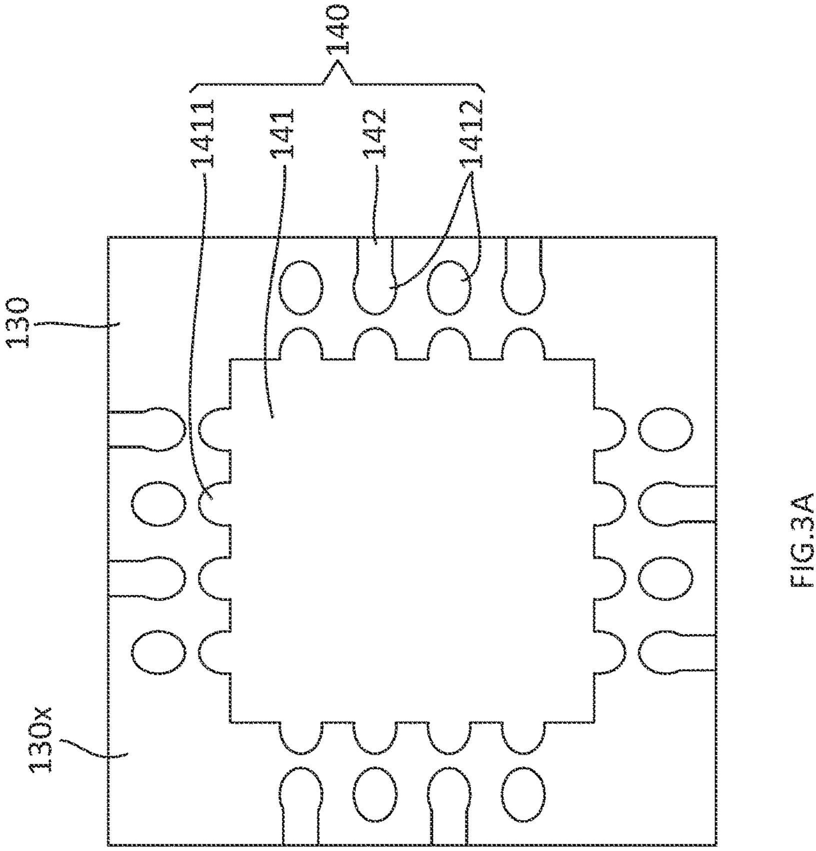

FIG. 2A shows a cross-sectional view of electronic device 100 at an early stage of manufacture. Substrate 110 can comprise dielectric structure 111 and conductive structure 112. In some examples, conductive structure 112 can comprise internal terminals 112*a*, external terminals 1124, and conductive paths 1125.

In some examples, dielectric structure 111 can comprise dielectric 1111, protective layer 1112 provided on top side 1111*x* of dielectric 1111, and protective layer 1113 provided on bottom side 1111*y* of dielectric 1111. In some examples, dielectric 1111 can comprise or be referred to as one or more dielectric layers, or a core layer. One or more layers or elements of conductive structure 112 can be interleaved or embedded between the one or more layers of dielectric 1111. In some examples dielectric 1111 can comprise plural stacked dielectric layers.

In some examples, protective layer 1112 and protective layer 1113 can be referred to as or comprise a dielectric, a dielectric layer, a solder mask, or a solder resist. In some examples, passivation layer 1112 can cover top side 1111*x* of dielectric 1111 or can cover portions of internal terminals 112*a* of conductive structure 112. In some examples, protective layer 1113 can cover bottom side 1111*y* of dielectric 1111, or can cover portions of external terminals 1124 of conductive structure 112.

In some examples, dielectric 1111, protective layer 1112, or protective layer 1113 can comprise an insulating material such as polymer, polyimide (PI), benzocyclobutene (BCB), polybenzoxazole (PBO), bismaleimide triazine (BT), a molding material, a phenolic resin, an epoxy, silicone, or an acrylate polymer. The overall thickness of dielectric structure 111 can be approximately 0.1 mm (millimeter) to 0.5 mm. In some examples, protective layer 1112 can protect internal terminals 112*a* of conductive structure 112 during the manufacturing process, and protective layer 1113 can protect external terminals 1124 of conductive structure 112 during the manufacturing process.

In some examples, conductive structure 112 can comprise traces, pads, vias, or wiring patterns to define conductive paths. Conductive structure 112 can comprise internal terminals 112*a* provided on top side 1111*x* of dielectric 1111, external terminals 1124 provided on bottom side 1111*y* of dielectric 1111, and conductive paths 1125 formed inside through the dielectric structure 1111. Internal terminals 112*a* can be coupled with external terminals 1124 through conductive paths 1125.

Internal terminals 112*a* and external terminals 1124 can be respectively provided on top side 1111*x* and bottom side 1111*y* of dielectric 1111 in a matrix form having rows or columns, respectively. In some examples, internal terminals 112*a* and external terminals 1124 can be referred to as or comprise conductors, conductive materials, substrate lands, conductive lands, substrate pads, wiring pads, connection pads, micro pads, or under-bump-metallurgies (UBMs). The thicknesses of internal terminals 112*a* and external terminals 1124 can range from approximately 1 μm to 50 μm.

Conductive paths 1125 can be extend through dielectric 1111 to couple internal terminals 112*a* with external terminals 1124. Conductive paths 1125 can be defined by portions of one or more conductive layers. In some examples, conductive paths 1125 can be referred to as or comprise conductors, conductive materials, conductive vias, circuit patterns, traces, or wiring patterns. In some examples, internal terminals 112*a*, external terminals 1124 or conductive paths 1125 can comprise copper, iron, nickel, gold, silver, palladium, or tin.

In some examples, substrate 110 can comprise or be referred to as a printed circuit board, a multilayer substrate, a laminate substrate, or a molded leadframe substrate. In some examples, substrate 110 can comprise or be referred to as a redistribution layer (RDL) substrate, a buildup substrate, or a coreless substrate.

In some examples, substrate 110 can be an RDL substrate. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride (Si3N4), silicon oxide (SiO2), or SiON. The inorganic dielectric layer(s) can be formed by growing the inorganic dielectric layers using an oxidation or nitridization process instead using photo-defined organic dielectric materials. Such inorganic dielectric layers can be filler-free, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Other substrates in this disclosure can also comprise an RDL substrate.

In some examples, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can be referred to as a printed circuit board (PCB) or a laminate substrate. Such a pre-formed substrate can be formed through a semi-additive or modified-semi-additive process. Other substrates in this description can also comprise a pre-formed substrate.

FIG. 2B shows a cross-sectional view of electronic device 100 at a later stage of manufacture. In the example shown in FIG. 2B, electronic components 120 can be proximate to internal terminals 112*a* of substrate 110. Electronic components 120 can be coupled to internal terminals 1123 of internal terminals 112*a* of substrate 110.

In some examples, pick-and-place equipment can pick up electronic components 120 and place them on substrate 110. Subsequently, electronic components 120 can be coupled or secured to internal terminals 1123 of substrate 110 through wirebonding, mass reflow, thermal compression, or a laser assisted bonding process.

In some examples, electronic components 120 can comprise or be referred to as semiconductor dies, semiconductor chips or semiconductor packages, integrated circuit components, sensor components, or discrete components. In some examples, electronic component 120 can comprise or be referred to active or passive components. Electronic component 120 can be provided with component terminals 121 on the top sides or bottom sides of electronic components 120 so as to be spaced apart from each other in row or column directions. In some examples, component terminals 121 can comprise or be referred to as pads, bumps, pillars, conductive posts, solder balls, or wire bonds. For example, component terminal 121 can comprise a metallic material, aluminum (Al), copper (Cu), an aluminum alloy, a copper alloy, or gold (Au). Component terminals 121 can comprise input/output terminals or power/ground terminals for electronic components 120.

In some examples, component terminal 121 can comprise a low-melting-point material or a conductive wire and can be connected to internal terminals 1123 of internal terminals 112*a* of substrate 110. For example, the low melting point material of component terminals 121 can comprise any selected from tin (Sn), silver (Ag), lead (Pb), Cu, Sn—Pb, Sn37-Pb, Sn95-Pb, Sn—Pb—Ag, Sn—Cu, Sn—Ag, Sn—Au, tin-bismuth (Sn—Bi), Sn—Ag—Cu. For example, the conductive wires can be gold wires, copper wires, or aluminum wires, and can bond component terminals 121 to internal terminals 1123 of substrate 110 through wire bonding equipment.

Component terminals 121 of electronic components 120 and internal terminals 1123 of substrate 110 can be coupled to each other through a low-melting-point material or a conductive wire. The overall thicknesses of electronic components 120 can range from approximately 20 μm to 800 μm.

Figures 2C, 2D:
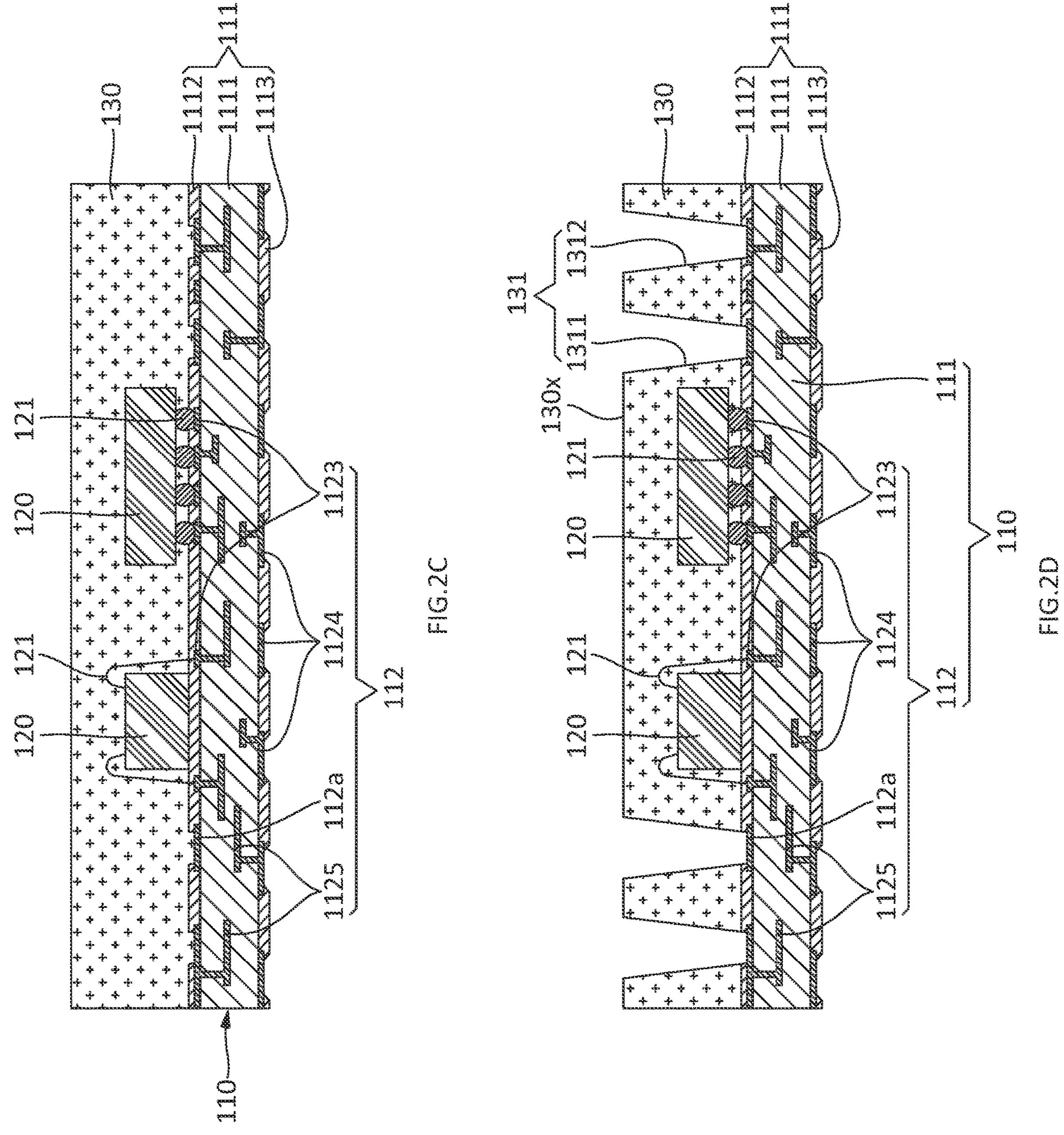

FIG. 2C shows a cross-sectional view of electronic device 100 at a later stage of manufacture. In the example shown in FIG. 2C, encapsulant 130 can be provided to cover substrate 110 and electronic components 120. Encapsulant 130 can be in contact with top side of substrate 110, and top and lateral sides of electronic components 120. Encapsulant 130 can cover internal terminals 112*a* of top side of substrate 110 and protective layer 1112. In some examples, encapsulant 130 can comprise or be referred to as a first encapsulant, a body, or a molding. For example, encapsulant 130 can comprise a mold compound, a polymer with filler, or a resin. For example, encapsulant 130 can be formed by compression molding, transfer molding, liquid body molding, vacuum lamination, paste printing, or film assist molding. The thickness of encapsulant 130 can range from approximately 60 μm to 1000 μm. Encapsulant 130 can protect substrate 110 and electronic components 120 from external elements.

FIG. 2D shows cross-sectional views of electronic device 100 at a later stage of manufacture. In the example shown in FIGS. 2D, apertures 131 extending from top side 130*x* of encapsulant 130 can be provided. In some examples, internal terminals 112*a* of substrate 110 can be exposed through, by, or from apertures 131 of encapsulant 130. Apertures 131 can be spaced apart or inward from the lateral sides of electronic components 120. Apertures 131 can be provided in the form of a matrix of one or more rows or columns. Apertures 131 can comprise aperture 1311 adjacent to the lateral side of electronic component 120, and aperture 1312 is located outward of aperture 1311. In some examples, after forming a mask pattern on the top side of encapsulant 130, the exposed region of encapsulant 30 can be removed through etching to form apertures 131. In some examples, apertures 131 can be referred to as or comprise openings or vias or grooves.

Figures 2E, 2F:
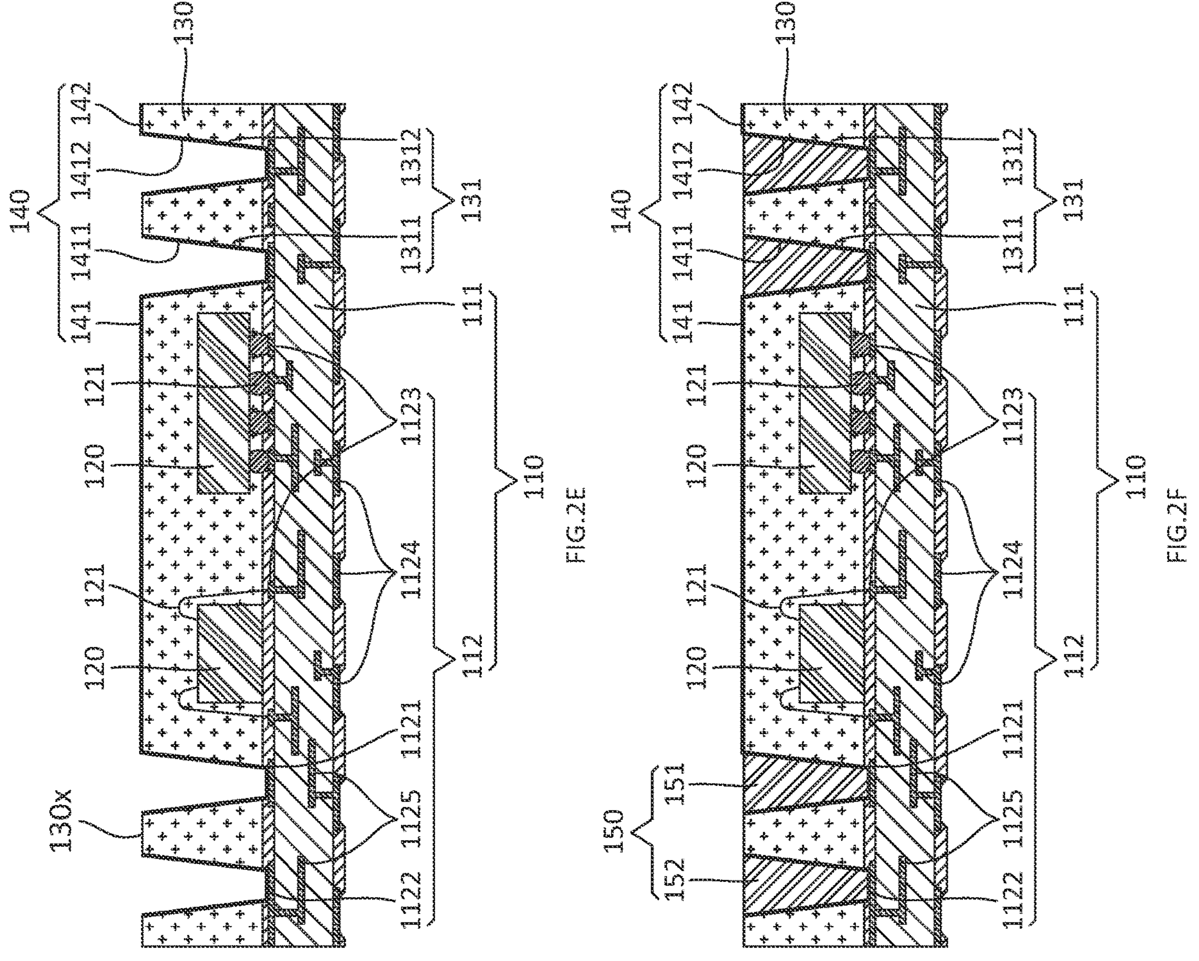

FIGS. 2E and 3A show a cross-sectional view and a top view respectively of electronic device 100 at a later stage of manufacture. In the example shown in FIGS. 2E and 3A, network conductive layering 140 can be provided to cover top side 130*x* of encapsulant 130. Network conductive layering 140 can be provided on the top side 130*x* of encapsulant 130, over electronic component 120, or over some or all of apertures 131, such as on apertures 1312 or apertures 1311. In some examples, network conductive layering 140 can comprise one or more applied conformal conductive layers. In some examples, the thickness of network conductive layering 140 can range from approximately 0.1 μm to 10 μm.

Network conductive layering 140 can comprise network cover 141, which can comprise or be referred to as a lid or a voltage plane. For example, if conductive layering 140 comprises one or more conformal conductive layers, network cover 141 can be provided by sputtering, spraying, or plating. In some examples, network cover 141 can comprise or be referred to as a powered network cover, configured to carry a power voltage of electronic device 100.

In some examples, network conductive layering 140 can comprise network contact 142 provided on the top side 130*x* of encapsulant 130 adjacent to apertures 1312. In some examples, network contact 142 is between apertures 1312 and a lateral side of encapsulant 30. In some examples, network contact 142 can comprise or be referred to as a ground contact configured to carry a ground voltage of electronic device 100.

In some examples, network conductive layering 140 can comprise interconnect contact 1411 covering aperture 1311 and internal terminal 1121 of internal terminals 112*a* of substrate 110, or can comprise interconnect contact 1412 covering aperture 1312 and internal terminal 1122 of internal terminals 112*a*. In some implementations, internal terminal 1121 can comprise or be referred to as a power or powered terminal carrying a power voltage of electronic device 100, and internal terminal 1122 can comprise or be referred to as a ground or grounded terminal carrying a ground voltage of electronic device 100. Interconnect contact 1411 can be coupled to or extend from network cover 141. Interconnect contact 1412 can be coupled to extend from network contact 142.

In some examples, network conductive layering 140 can comprise one or more layers of titanium (Ti), titanium-tungsten (TiW) or Cu. For example, network conductive layering 140 can be formed to a uniform thickness at a time by electroless plating, electrolytic plating, sputtering, physical vapor deposition (PVD), chemical vapor deposition (CVD), metal-organic CVD (MOCVD), atomic layer deposition (ALD), low pressure CVD (LPCVD), or plasma-enhanced CVD (PECVD) method. Network conductive layering 140 can comprise one or more stacked conductive layers. The thickness of network conductive layering 140 can range from approximately 0.1 μm to 10 μm in some implementations. As shown in FIG. 2E, network cover 141 and interconnect contact 1411 can be a continuous structure.

FIGS. 2F and 3B show a cross-sectional view and a top view respectively of electronic device 100 at a later stage of manufacture. In the example shown in FIGS. 2F and 3B, interconnects 150 fills the interior portions of apertures 131. Interconnects 150 can comprise interconnect 151 filling aperture 1311 and coupled to network cover 141. Interconnects 150 can comprise interconnect 152 filling aperture 1312. In some examples interconnect 152 can be coupled with network contact 142.

Interconnect 151 can couple internal terminal 1121 to network cover 141. Interconnect 152 can couple internal terminal 1122 to network contact 142. In some examples, interconnects 150 need not be used to fill apertures 131, where interconnect contact 1411 would still couple internal terminal 1121 to network cover 141, or where interconnect contact 1412 would still couple internal terminal 1122 to network contact 142.

Each of interconnect 151 and interconnect 152 can comprise or be referred to as a via, a through-mold via (TMV), a conductor-coated via, a conductor-filled via, a vertical wire, a pillar, a post, a stud, a solder ball or a solder-coated conductive core ball (CCB).

In some examples, interconnect 150 can be formed by electroplating or sputtering. For example, interconnects 150 can be formed to fill apertures 131, relying on interconnect contact 1411 or interconnect contact 1412 as seeds for plating. For example, interconnects 150 can be formed by forming a mask pattern to cover the upper portion of encapsulant 130 and then sputtering to fill the interior portions of apertures 131. Interconnect 151 can be coupled to internal terminal 1121 through interconnect contact 1411, and interconnect 152 can be coupled to internal terminal 1122 through interconnect contact 1412.

In some examples, interconnect contact 1411 and interconnect 151 can be considered part of each other, or interconnect contact 1412 and interconnect 152 can be considered part of each other.

In some examples, interconnect 151 can comprise or be referred to as a power or powered interconnect configured to carry power voltage of electronic device 100, or interconnect 152 can comprise or be referred to as a ground or grounded interconnect configured to carry ground voltage of electronic device 100. The height of interconnects 150 can be the similar to the height of encapsulant 130. For instance, the top of interconnects 150 can be substantially coplanar with the top of encapsulant 130.

Figures 2G, 2H:
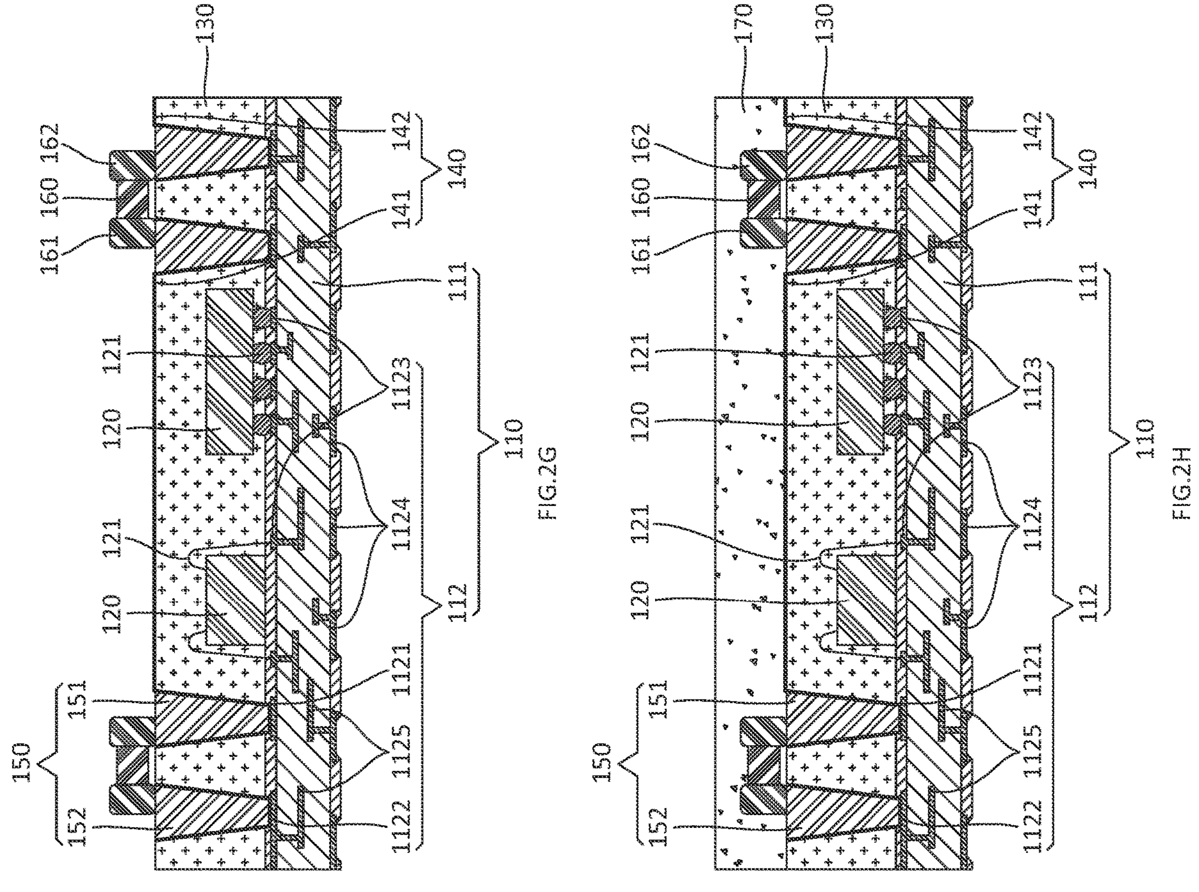

FIG. 2G shows a cross-sectional view of electronic device 100 at a later stage of manufacture. In the example shown in FIG. 2G, electronic component 160 can be provided on interconnect 150. Electronic component 160 can comprise terminal 161 and terminal 162. For example, terminal 161 can be coupled the top side of interconnect 151, or terminal 162 can be coupled with the top side of interconnect 152.

In some examples, pick-and-place equipment can pick up electronic component 160 and place on the top portion between interconnect 151 and interconnect 152. Subsequently, terminal 161 or terminal 162 of electronic component 160 can be secured to interconnect 151 or interconnect 152, respectively, such as by reflowing terminals 161 or 162.

In some examples, electronic component 160 can include corresponding elements or features similar to electronic component 120 previously described. For example, terminal 161 and terminal 162 of electronic component 160 can be similar to component terminals 121 of electronic component 120. In some examples, electronic component 160 can comprise or be referred to as a passive component or a decoupling capacitor. For example, electronic component 160 can reduce high-frequency noise. The overall thickness of electronic component 160 can range from approximately 100 μm to 800 μm.

FIG. 2H shows a cross-sectional view of electronic device 100 at a later stage of manufacture. In the example shown in FIG. 2H, encapsulant 170 can be provided to cover encapsulant 130, electronic component 160, and network cover 141. Encapsulant 170 can cover interconnect 150. In some examples, encapsulant 170 can be in contact with the top side of encapsulant 130, the top side of interconnect 150, the lateral and top sides of electronic component 160, and the top side of network cover 141. Network cover 141 and network contact 142 can be interposed between encapsulant 130 and encapsulant 170.

Encapsulant 170 can include corresponding elements, features, materials or manufacturing methods similar to those of encapsulant 130 previously described. In some examples, the thickness of encapsulant 170 can range from approximately 60 μm to 1000 μm. In some examples, encapsulant 170 can comprise or be referred to as a second encapsulant, a body, or a molding. Encapsulant 170 can protect electronic component 160 and network cover 141 from external elements. Optionally, encapsulant 170 need not be provided.

Figure 2I:
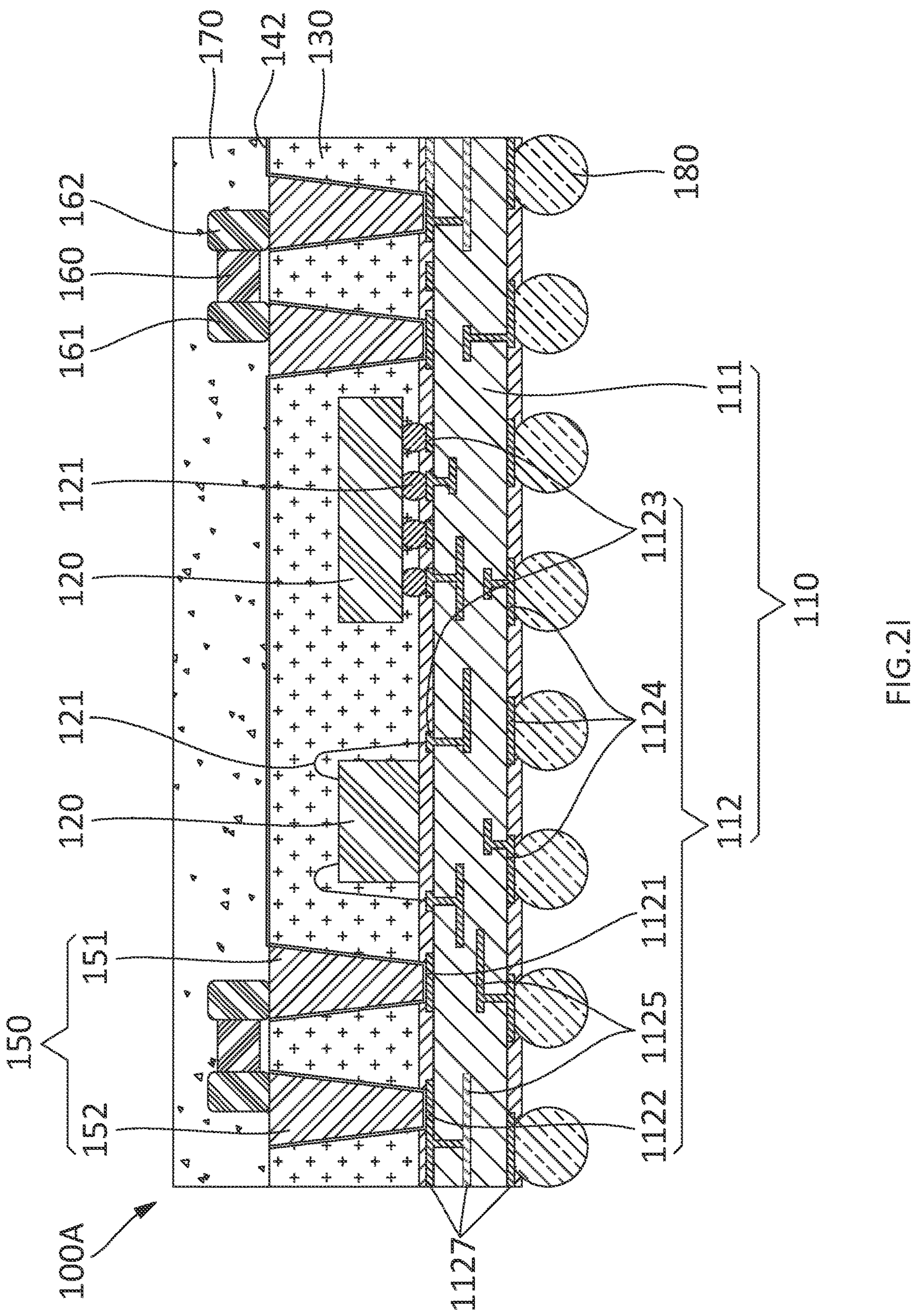

FIG. 2I shows a cross-sectional view of electronic device 100 at a later stage of manufacture. In the example shown in FIG. 2I, external interconnect 180 can be coupled to external terminal 1124 of substrate 110.

External interconnect 180 can be coupled to electronic component 120 through conductive structure 112 of substrate 110, or can be coupled to electronic component 160 through conductive structure 112 of substrate 110 and interconnect 150. Electronic components 120 and 160 can be coupled to each other through substrate 110 or can be coupled to external interconnect 180. In some examples, external interconnect 180 can comprise Sn, Ag, Pb, Cu, Sn—Pb, Sn37-Pb, Sn95-Pb, Sn—Pb—Ag, Sn—Cu, Sn—Ag, Sn—Au, Sn—Bi, or Sn—Ag—Cu. For example, after forming a conductive material including solder on the bottom side of external terminal 1124 of substrate 110 through a ball drop method, external interconnect 180 can be formed through a reflow process. In some examples, external interconnect 180 can comprise or be referred to as a conductive ball, such as a solder ball, a conductive pillar, such as a copper pillar, or a conductive post having a solder cap formed over the copper pillar. In some examples, the size of external interconnect 180 can range from approximately 100 μm to 500 μm. In some examples, external interconnects 180 can be referred to as an external input/output or power/ground terminal of electronic device 100.

A singulation process of separating substrate 110 and encapsulants 130 and 170 into singulated electronic devices 100A by sawing can be performed. Substrate 110 can laterally expose one or more portions of internal terminals 1122, one or more portions of external terminals 1124, or one or more portions of conductive paths 1125 of substrate 110. Such exposed portions can be referred as network contacts 1127 and can be considered part of network structure NS2. Singulated electronic device 100A can also laterally expose network contact 142.

Figure 2J:
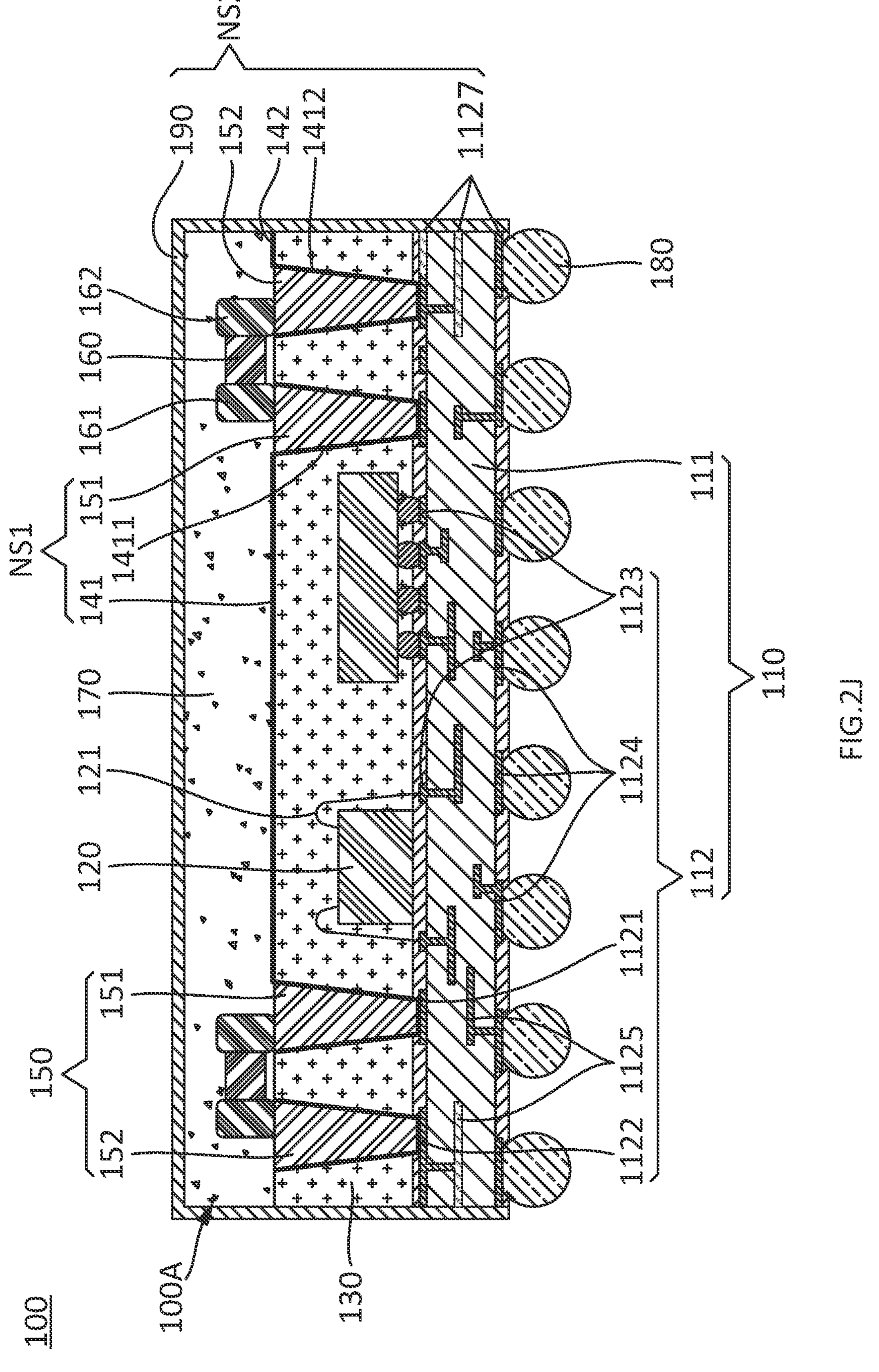

FIG. 2J shows a cross-sectional view of electronic device 100 at a later stage of manufacture. In the example shown in FIG. 2J, network cover 190 can be formed to cover the top and lateral sides of singulated electronic device 100A. Network cover 190 can comprise cover ceiling 191 covering the top side of singulated electronic device 100A, or cover sidewalls 192 covering the lateral sides of singulated electronic device 100A. Network cover 190 can be part of network structure NS2.

Network cover 190 can be coupled to the top and lateral sides of encapsulant 170, the lateral sides of encapsulant 130, and the lateral sides of substrate 110, and can comprise a substantially uniform thickness. In some examples, cover sidewalls 192 of network cover 190 can be coupled to network contacts 142 or 1127 exposed at the lateral sides of singulated electronic device 100A. Network cover 190 can be coupled to internal terminal 1122 of substrate 110 through network contacts 142 or 1127 as part of network structure NS2. Network cover 190 can be made of a conductive material capable of shielding electromagnetic interference to or from electronic component 120. In some examples, network cover 190 can comprise or be referred to as a conformal shield, a conformal conductive layer, an EMI shield, or a plane. For example, network cover 190 can comprise Ag, Cu, Al, nickel (Ni), palladium (Pd), or chromium (Cr). For example, network cover 190 can be formed by a sputtering, spraying or plating method. In some examples, the thickness of network cover 190 can range from approximately 0.1 μm to 10 μm.

Completed electronic device 100 can comprise substrate 110, electronic components 120 and 160, encapsulants 130 and 170, network structures NS1 and NS2, and external interconnect 180.

Figure 4:
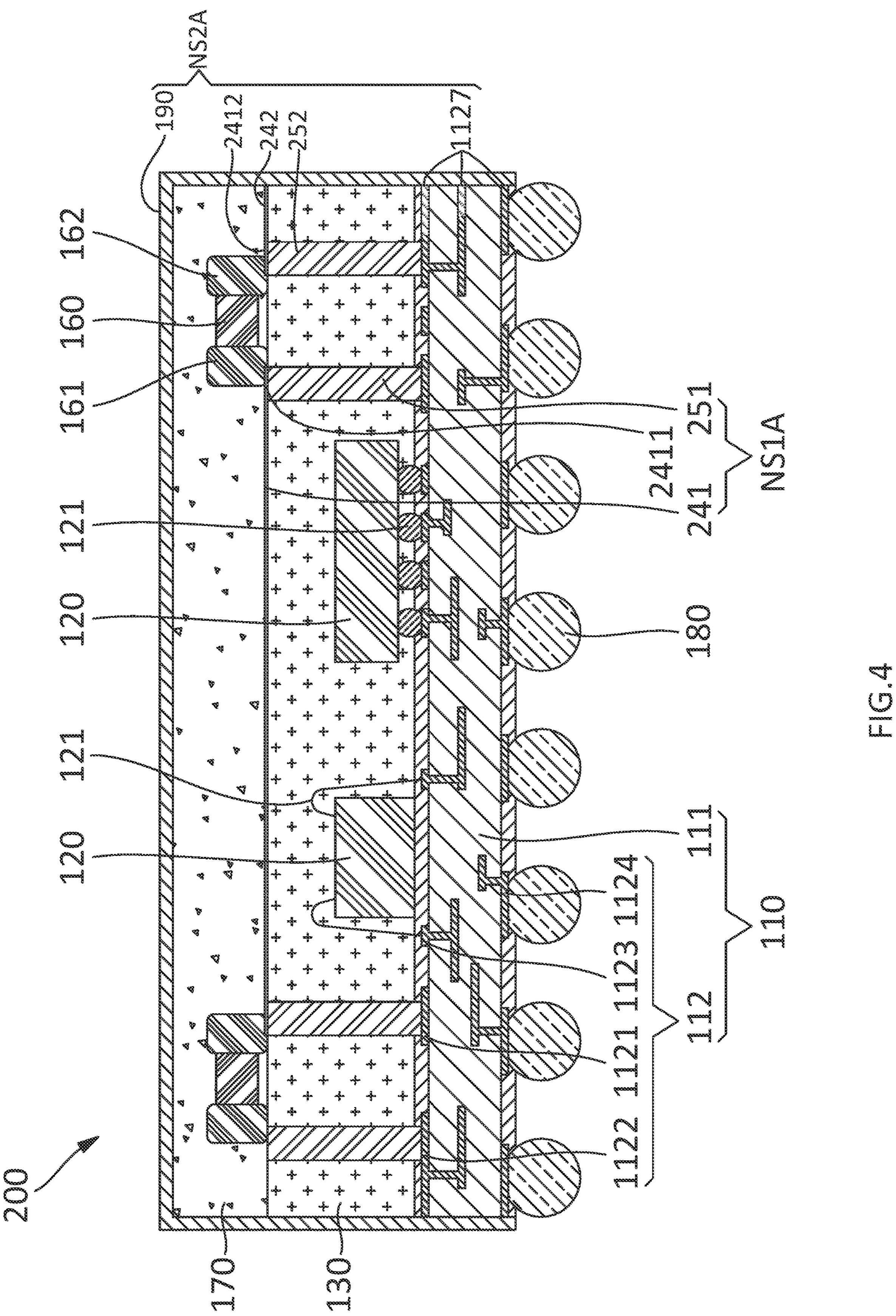
FIG. 4 shows a cross-sectional view of an example electronic device.

FIG. 4 shows a cross-sectional view of an example electronic device 200. In the example shown in FIG. 4, electronic device 200 can comprise substrate 110, electronic components 120 and 160, encapsulants 130 and 170, network structures NS1A and NS2A, and external terminals 180.

Electronic device 200 can include corresponding elements, features, materials, or manufacturing methods similar to those of electronic device 100. For example, substrate 110, electronic components 120 and 160, encapsulants 130 and 170, and external terminals 180 of electronic device 200 can be similar to those of electronic device 100 shown in FIG. 1A and FIG. 1B.

Interconnects 251, 252 can be similar to interconnects 151, 152 and can comprise or be referred to as for example a vertical wire, a pillar, a post, or a stud.

Network structure NS1A can be similar to Network structure NS1 and can comprise network cover 241, interconnect contact 2411 or interconnect 251.

Network structure NS2A can be similar to Network structure NS2 and can comprise network contact 1127, network contact 242, interconnect contact 2412, interconnect 252, or network cover 190.

Interconnect contact 2411 can be similar to interconnect contact 1411, and can cover the top side of interconnect 251. In some examples, interconnect contact 2411 and network cover 241 can be considered part of, or extensions of, each other.

Interconnect contact 2412 can be similar to interconnect contact 1412, and can cover the top side of interconnect 252. In some examples, interconnect contact 2412 and network contact 242 can be considered part of, or extensions of, each other.

In the present example, in network structures NS1A and NS2A, after interconnect 251 and interconnect 252 are provided, network cover 241 and network contact 242 can be provided. In the present example, after interconnect 251 and interconnect 252 are provided, encapsulant 130 can be provided.

Figure 5:
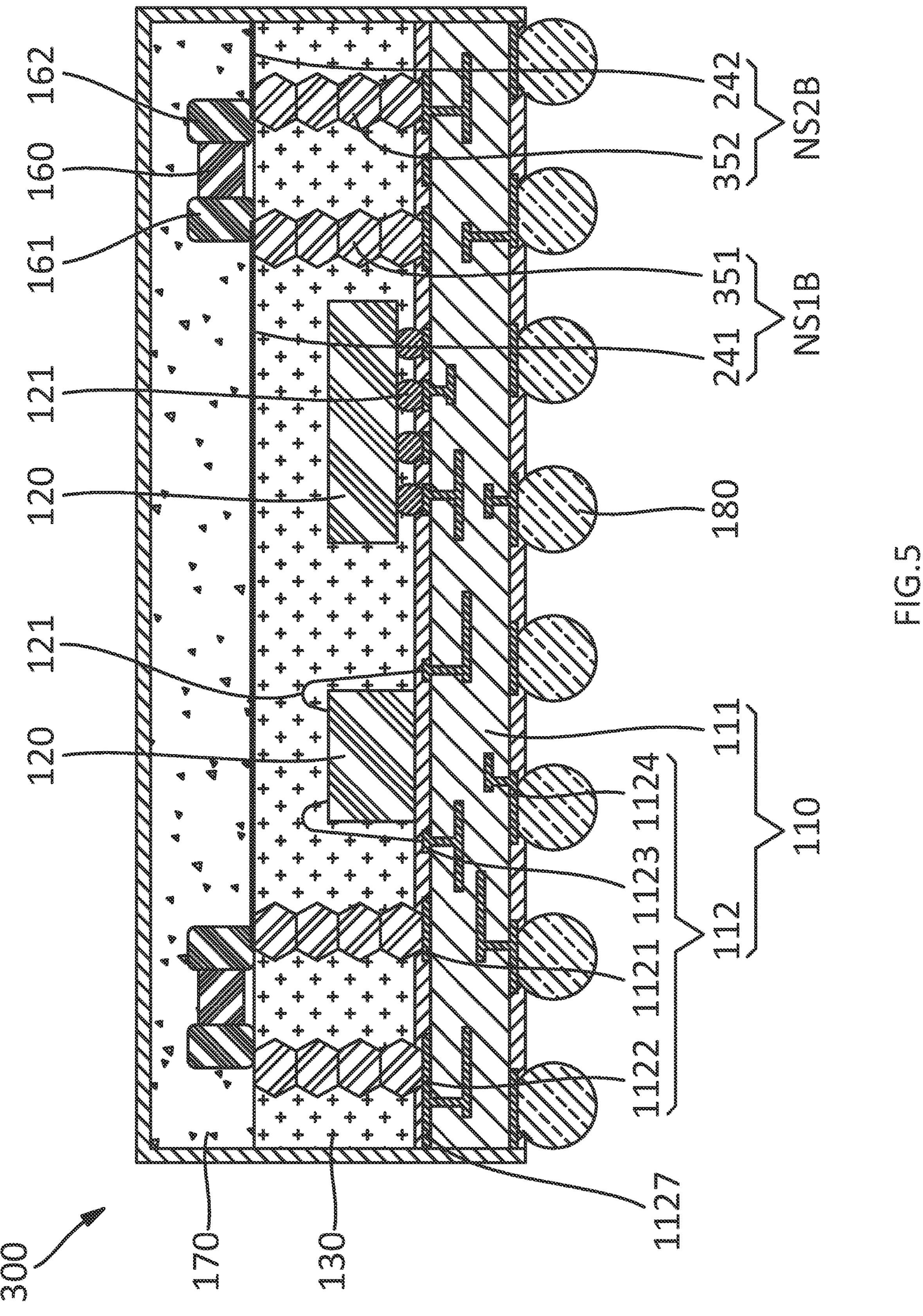
FIG. 5 shows a cross-sectional view of an example electronic device.

FIG. 5 shows a cross-sectional view of an example electronic device 300. In the example shown in FIG. 5, electronic device 300 can comprise substrate 110, electronic components 120 and 160, encapsulants 130 and 170, network structures NS1B and NS2B, and external terminals 180.

In the present example, electronic device 300 can include corresponding elements, features, materials, or manufacturing methods similar to those of electronic device 200. In the present example, network structures NS1B and NS2B of electronic device 300 can comprise network structure NS1B including network cover 241 and interconnect 351, and network structure NS2B including network contact 242, interconnect 352 and network cover 190. In the present example, interconnect 351 and interconnect 352 can be stacked bumps.

Figure 6:
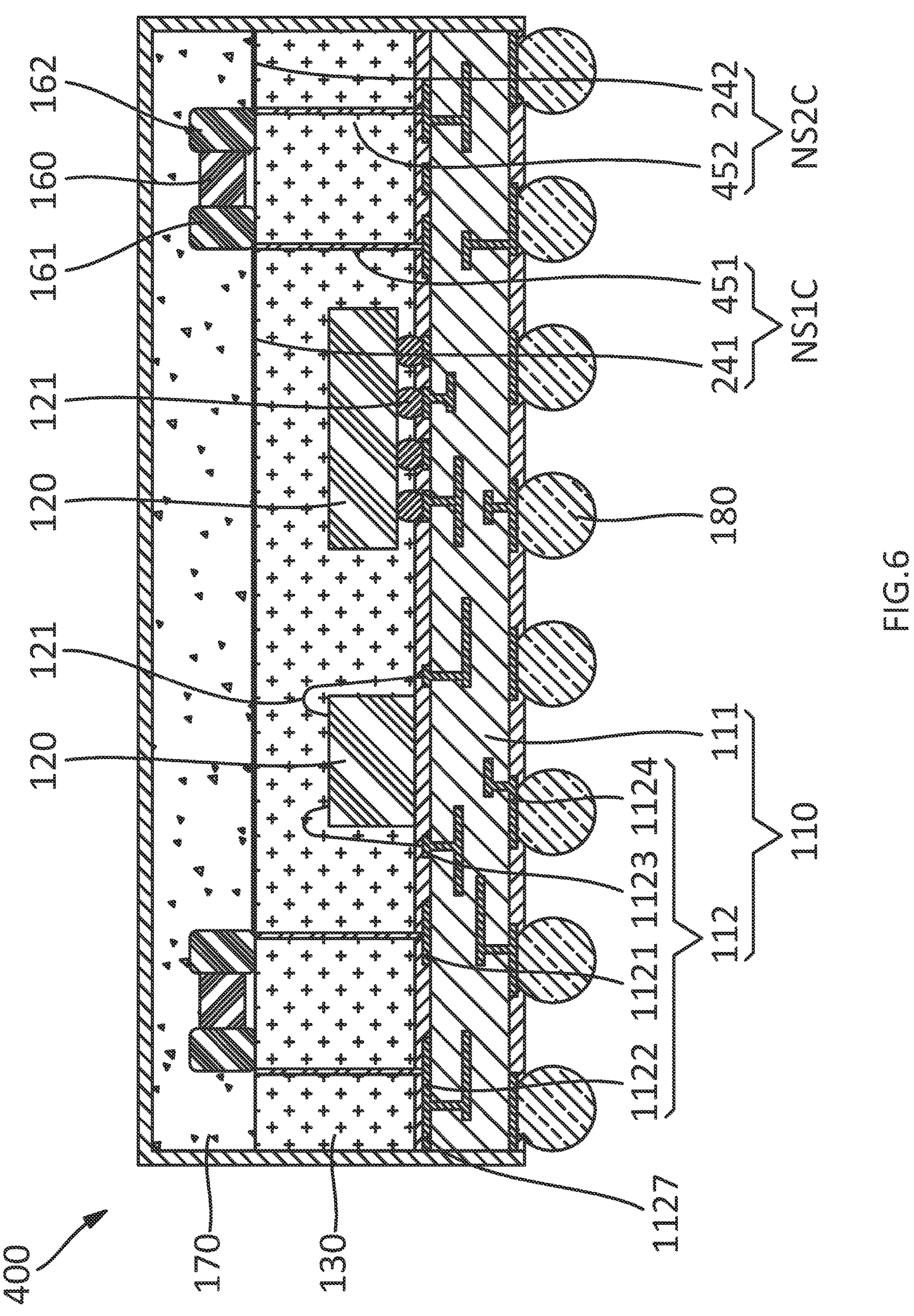
FIG. 6 shows a cross-sectional view of an example electronic device.

FIG. 6 shows a cross-sectional view of an example electronic device 400. In the example shown in FIG. 6, electronic device 400 can comprise substrate 110, electronic components 120 and 160, encapsulants 130 and 170, network structures NS1C and NS2C, and external terminals 180.

In the present example, electronic device 400 can include corresponding elements, features, materials, or manufacturing methods similar to those of electronic device 200. In the present example, network structures NS1C and NS2C of electronic device 400 can comprise network structure NS1C including network cover 241 and interconnect 451, and network structure NS2C including network contact 242, interconnect 452 and network cover 190. In the present example, interconnect 451 and interconnect 452 can be vertical wires.

Figure 7:
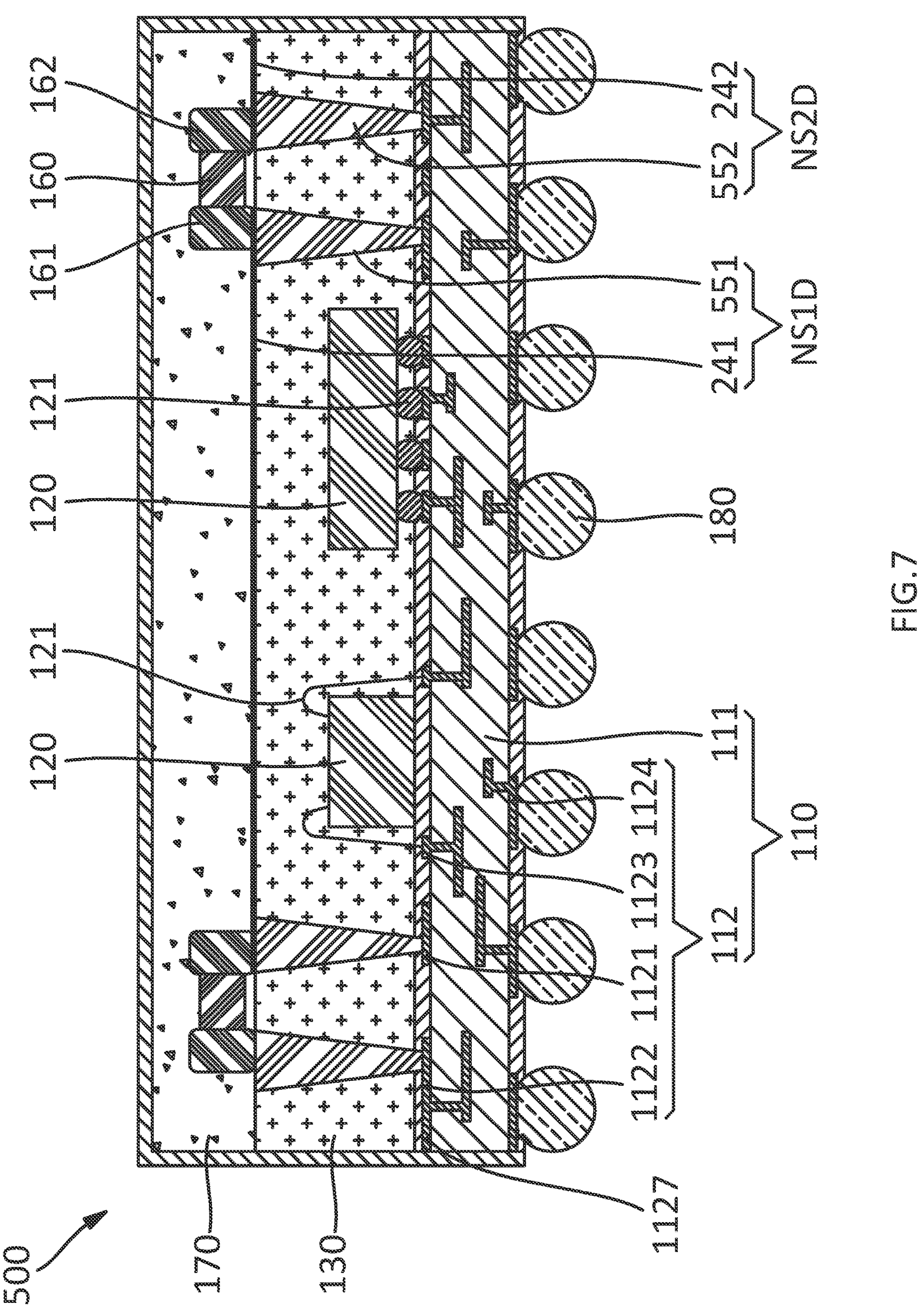
FIG. 7 shows a cross-sectional view of an example electronic device.

FIG. 7 shows a cross-sectional view of an example electronic device 500. In the example shown in FIG. 7, electronic device 500 can comprise substrate 110, electronic components 120 and 160, encapsulants 130 and 170, network structures NS1D and NS2D, and external terminals 180.

In the present example, electronic device 500 can include corresponding elements, features, materials, or manufacturing methods similar to those of electronic device 200. In the present example, network structures NS1D and NS2D of electronic device 500 can comprise network structure NS1D including network cover 241 and interconnect 551, and network structure NS2D including network contact 242, interconnect 552 and network cover 190.

In the present example, network structures NS1D and NS2D of electronic device 500 can comprise network structure NS1D including network cover 241 and interconnect 551, and network structure NS2D including network contacts 242 and 1127, interconnect 552 and network cover 190. In the present example, in network structures NS1D and NS2D, after interconnect 551 and interconnect 552 are provided to fill apertures of encapsulant 130, network cover 241 and network contact 242 can be provided. In the present example, each of interconnect 551 and interconnect 552 can comprise or be referred to as a solder, a via, a through-mold via, a conductor-coated via, a conductor-filled via, a solder ball or a solder-coated conductive core ball.

Figure 8A:
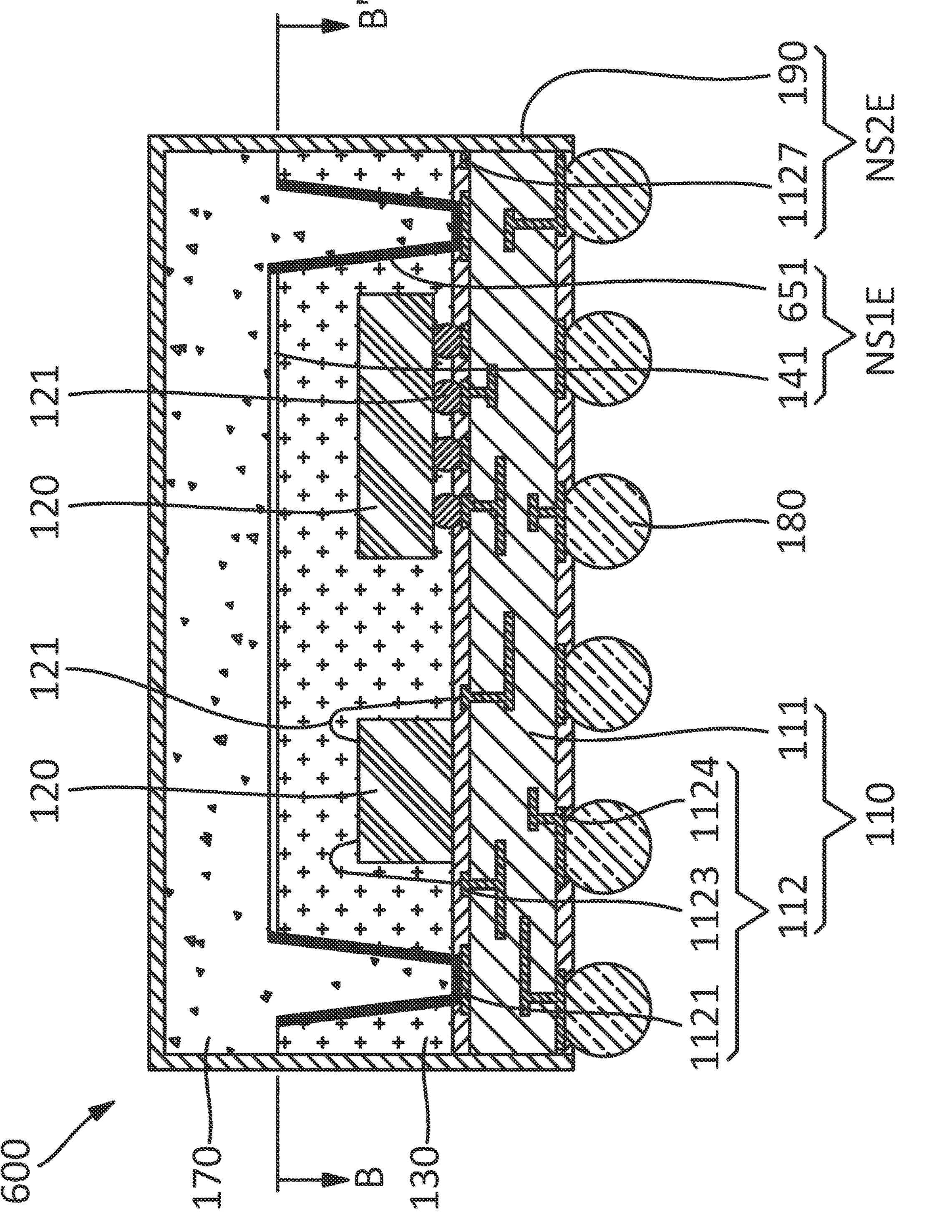
FIGS. 8A and 8B show cross-sectional views of an example electronic device.
Figure 8B:
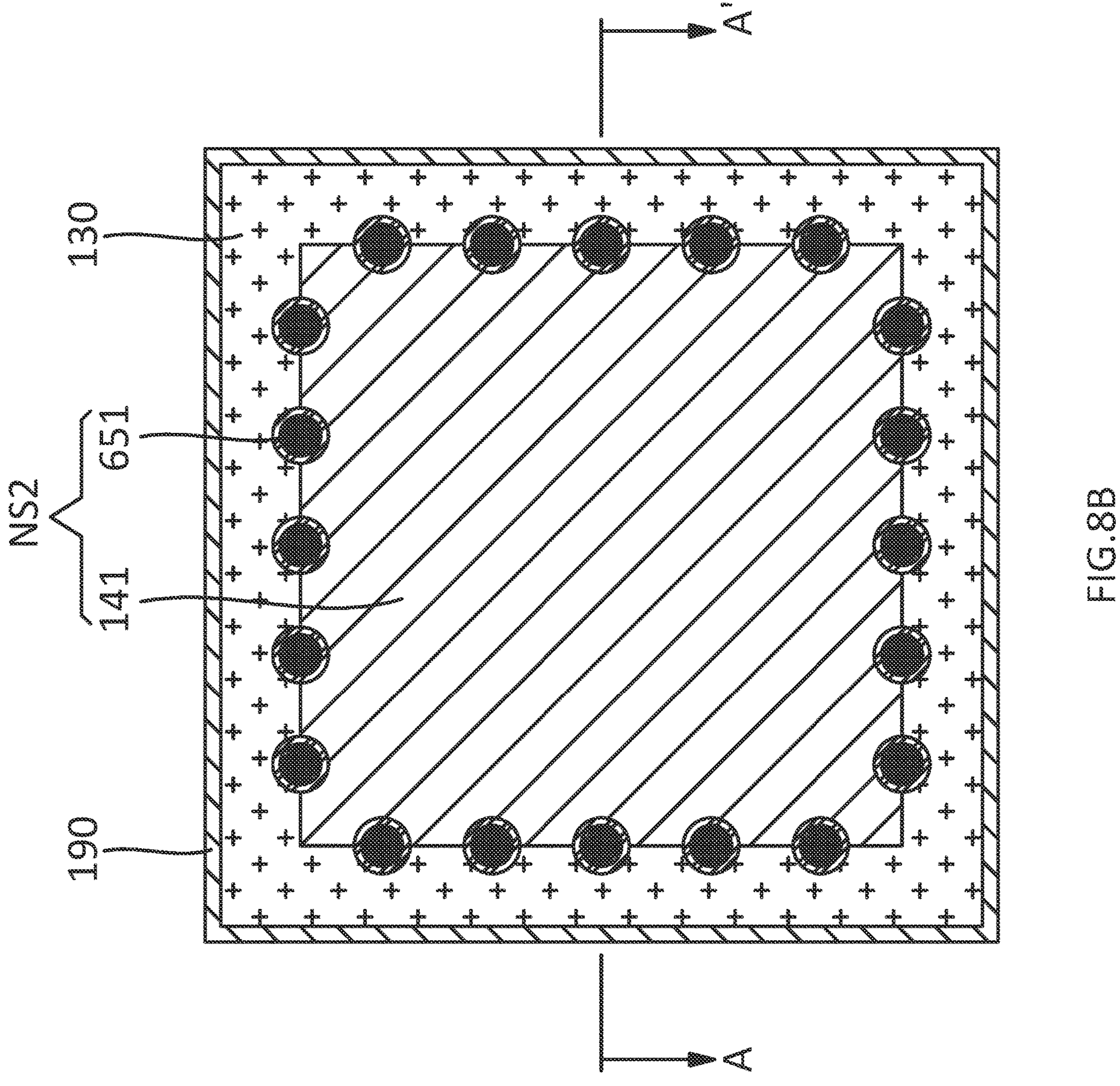

FIGS. 8A and 8B show cross-sectional views of an example electronic device 600. FIG. 8A shows a cross-sectional view taken along line A-A' of FIG. 8B, and FIG. 8B shows a cross-sectional view taken along line B-B' of FIG. 8A. In the example shown in FIGS. 8A and 8B, electronic device 600 can comprise substrate 110, electronic components 120 and 160, encapsulants 130 and 170, network structures NS1E and NS2E, and external terminals 180.

In the present example, electronic device 600 can include corresponding elements, features, materials, or manufacturing methods similar to those of electronic device 100. For example, substrate 110, electronic component 120, encapsulants 130 and 170, and external terminals 180 of electronic device 600 can be similar to those of electronic device 100 shown in FIG. 1A and FIG. 1B. In the present example, electronic device 600 need not comprise electronic component 160, network contact 142, or interconnect 152 of network structures NS1E and NS2E.

In the present example, network structures NS1E and NS2E can comprise network structure NS1E including network cover 141 and interconnect 651, and network structure NS2E including network contact 1127 and network cover 190. Network cover 190 can be coupled to network contact 1127 of substrate 110. Interconnect 651 can be coated to a predetermined thickness without completely filling the interior portions of apertures 131. In some examples, interconnect 651 can be similar to interconnect contact 1411 of electronic device 100. Interconnect 651 and network cover 141 can be part of, or extensions of, each other.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:

a substrate having a substrate top side, a substrate bottom side opposite to the substrate top side, and a substrate conductive structure comprising:

internal terminals adjacent to the substrate top side and comprising a first internal terminal;

a grounded path coupled to the first internal terminal; and a powered path;

a first electronic component coupled to the substrate top side;

a first encapsulant covering the first electronic component and the substrate top side and having first apertures and second apertures, wherein the powered path is exposed by the first apertures and the grounded path is exposed by the second apertures, wherein the first internal terminal is exposed in a first one of the second apertures, wherein the first one of the second apertures comprises a sidewall, and wherein the first encapsulant comprises a first encapsulant top side;

a first network structure comprising:

a first network cover comprising a conformal conductive layer extending laterally over the first encapsulant top side; and first network interconnects coupled to the first network cover and the powered path through the first apertures; and a second network structure comprising:

second network interconnects in the second apertures and coupled to the grounded path;

a second network cover having a second cover ceiling and second cover sidewalls extending from the second cover ceiling;

a second network contact extending laterally along the first encapsulant top side to an outer edge of the electronic device; and a first interconnect contact covering the sidewall of the first one of the second apertures and the first internal terminal, the first interconnect contact interposed between the first encapsulant and a first one of the second network interconnects;

wherein:

the first interconnect contact is coupled to the second network contact proximate to the first encapsulant top side;

the second network cover is over the first network cover;

the second network contact contacts one of the second cover sidewalls at the outer edge of the electronic device; and the first network cover is over the first electronic component.

2. The electronic device of claim 1, further comprising:

a second encapsulant over the first encapsulant;

wherein:

the second encapsulant covers the second network contact;

the second encapsulant comprises a second encapsulant top side; and the second cover ceiling is a continuous layer over the second encapsulant top side.

3. The electronic device of claim 1, wherein:

the first network interconnects are on each side of the first electronic component;

each of the first network interconnects comprise outer edges distal to the first network cover;

the outer edges define a perimeter around the first network cover; and the first network cover is inside of the perimeter.

4. The electronic device of claim 2, further comprising:

a passive device coupled to one of the second network interconnects and to one of the first network interconnects, wherein:

the second encapsulant covers the passive device.

5. The electronic device of claim 2, wherein:

the first network interconnects and the second network interconnects comprise through-mold vias.

6. The electronic device of claim 2, wherein:

the first network interconnects and the second network interconnects comprise conductive pillars.

7. The electronic device of claim 1, further comprising:

a second interconnect contact;

wherein:

the internal terminals comprise a second internal terminal;

the powered path is coupled to the second internal terminal;

the second internal terminal is exposed in a first one of the first apertures;

the first one of the first apertures comprises a sidewall;

the second interconnect contact covers the sidewall of the first one of the first apertures and the second internal terminal;

the second interconnect contact is interposed between the first encapsulant and a first one of the first network interconnects; and the second interconnect contact is coupled to the first network cover proximate to the first encapsulant top side.

8. The electronic device of claim 1, wherein:

the second apertures are interposed between the first apertures and the outer edge of the electronic device; and the second network contact is one of a plurality of second network contacts coupled to the second cover sidewalls.

9. The electronic device of claim 1, wherein:

the second cover ceiling is a continuous layer;

the substrate comprises a lateral side;

a portion of the grounded path is exposed from the lateral side; and one of the second cover sidewalls contacts the grounded path at the lateral side.

10. The electronic device of claim 7, further comprising:

a patterned conductive layer structure comprising:

the first network cover;

the first interconnect contact; and the second interconnect contact;

wherein:

the first network cover, the first interconnect contact, the second interconnect contact, and the second network contact are monolithically formed of a common conductive material.

11. An electronic device, comprising:

a substrate having a substrate top side, a substrate bottom side opposite to the substrate top side, a substrate lateral side; and a substrate conductive structure comprising:

a first power terminal at the substrate top side; and a ground terminal at the substrate top side;

a first electronic component coupled to the substrate top side;

a first encapsulant covering the first electronic component and the substrate top side and comprising a first aperture and a second aperture, wherein:

the first aperture comprises a first aperture sidewall;

the second aperture comprises a second aperture sidewall;

the first encapsulant comprises a top side;

the first power terminal is exposed by the first aperture; and the ground terminal is exposed by the second aperture;

a network comprising:

a first network cover comprising a conductive layer extending laterally over the top side of the first encapsulant;

a first interconnect contact comprising the conductive layer covering the first aperture sidewall and coupled to the first power terminal and the first network cover;

a first network interconnect over the first interconnect contact in the first aperture, wherein the first interconnect contact is interposed between the first encapsulant and the first network interconnect;

a second interconnect contact covering the second aperture sidewall and coupled to the ground terminal;

a second network interconnect over the second interconnect contact in the second aperture, wherein the second interconnect contact is interposed between the first encapsulant and the second network interconnect;

a second network cover comprising:

a second cover ceiling over the first network cover; and second cover sidewalls extending from the second cover ceiling; and a network contact coupled to the second interconnect contact and extending laterally over the top side of the first encapsulant to an outer edge of the first encapsulant; and a second encapsulant over the first encapsulant covering the first interconnect contact, the second interconnect contact, the network contact, and the first network cover;

wherein:

the network contact is coupled to one of the second cover sidewalls at the outer edge of the first encapsulant.

12. The electronic device of claim 11, further comprising:

a second electronic component coupled to the first interconnect contact and the second interconnect contact.

13. The electronic device of claim 12, wherein:

the second electronic component comprises a capacitor;

the second encapsulant comprises a second encapsulant top side; and the second cover ceiling contacts the second encapsulant top side.

14. The electronic device of claim 11, wherein:

the first network cover comprises of a first portion of the conductive layer;

the network contact comprises a second portion of the conductive layer; and the first portion is electrically decoupled from the second portion.

15. The electronic device of claim 11, wherein:

the first aperture is one of a plurality of first apertures;

the first interconnect contact is one of a plurality of first interconnect contacts within the plurality of first apertures;

the plurality of first apertures are located on four sides of the first network cover;

the plurality of first apertures comprise an outer edges distal to the first network cover;

the outer edges define a perimeter around the first network cover; and the first network cover is inside of the perimeter.

16. The electronic device of claim 11, wherein:

the substrate conductive structure comprises a second power terminal;

the first encapsulant comprises a third aperture;

the second power terminal is exposed in the third aperture;

the first aperture and the third aperture are on opposing sides of the first electronic component;

the network comprises a third interconnect contact in the third aperture comprising the conductive layer and coupled to the first network cover and the second power terminal;

the first interconnect contact and the third interconnect contact extend from the first network cover; and the first network cover overlies the first electronic component.

17. A method of manufacturing an electronic device, comprising:

providing a substrate having a substrate top side, a substrate bottom side opposite to the substrate top side, and a substrate conductive structure comprising:

internal terminals adjacent to the substrate top side and comprising a first internal terminal and a second internal terminal;

a grounded path coupled to the first internal terminal; and a powered path coupled to the second internal terminal;

coupling a first electronic component to the substrate top side;

providing a first encapsulant covering the first electronic component and the substrate top side and comprising a first encapsulant top side;

providing a first aperture extending through the first encapsulant to expose the first internal terminal, the first aperture comprising a first aperture sidewall;

providing a second aperture extending through the first encapsulant to expose the second internal terminal, the second aperture comprising a second aperture sidewall;

providing a conductive layer over the first encapsulant top side, over the first aperture sidewall, over the first internal terminal, over the second aperture sidewall, and over the second internal terminal;

patterning the conductive layer to provide:

a first network cover over the first encapsulant top side;

a first interconnect contact coupled to the first network cover and over the first aperture sidewall and over the first internal terminal;

a second interconnect contact over the second aperture sidewall and the second internal terminal, wherein the second interconnect contact is electrically decoupled from the first interconnect contact and the first network cover; and a network contact extending laterally along the first encapsulant top side to an outer edge of the first encapsulant and coupled to the second interconnect contact;

providing a first network interconnect in the first aperture over the first interconnect contact;

providing a second network interconnect in the second aperture over the second interconnect contact; and providing a second network cover having a second cover ceiling and a second cover sidewall extending from the second cover ceiling, wherein the second cover sidewall is coupled to the network contact at the outer edge of the first encapsulant;

wherein:

the first network cover, the first interconnect contact, and the first network interconnect are part of the powered path; and the second network cover, the second interconnect contact, the network contact, and the second network interconnect are part of the grounded path.

18. The method of claim 17, further comprising:

providing a second encapsulant over the first encapsulant before providing the second network cover;

wherein:

the network contact comprises a top side;

the second encapsulant contacts the top side of the network contact;

the second encapsulant comprises a second encapsulant top side; and the second cover ceiling is a continuous layer over the second encapsulant top side.

19. The method of claim 18, wherein:

providing the second network interconnect comprises providing the second network interconnect coplanar with the top side of the network contact.

20. The method of claim 17, further comprising:

coupling a passive device to the first network interconnect and the second network interconnect.

* * * * *